(12) United States Patent
Chen et al.

(10) Patent No.: US 6,386,276 B1
(45) Date of Patent: May 14, 2002

(54) HEAT-DISSIPATING DEVICE

(75) Inventors: Chang Shun Chen; Kuo-Cheng Lin; Wen-Shi Huang, all of Taoyuan Shien (TW)

(73) Assignee: Delta Electronics, Inc. (TW)

( * ) Notice: Subject to any disclaimer, the term of this patent is extended or adjusted under 35 U.S.C. 154(b) by 0 days.

(21) Appl. No.: 09/793,060

(22) Filed: Feb. 26, 2001

(30) Foreign Application Priority Data

Dec. 8, 2000 (TW) .................................. 89221387 U

(51) Int. Cl.[7] .................................................. F28F 3/02
(52) U.S. Cl. ...................... 165/121; 165/80.3; 165/125; 165/122; 361/697; 415/176; 416/95; 417/423.1; 417/354; 417/366
(58) Field of Search ............................... 165/121, 122, 165/124, 125, 126, 80.3, 185; 415/176, 180; 416/95, 96 R; 417/423.1, 366, 368, 354; 361/697

(56) References Cited

U.S. PATENT DOCUMENTS

| 2,709,035 | A | * | 5/1955 | Schmidt ....................... 417/368 |
| 3,274,410 | A | * | 9/1966 | Boivie ....................... 417/423.1 |
| 3,449,605 | A | * | 6/1969 | Wilson ......................... 415/176 |
| 4,167,376 | A | * | 9/1979 | Papst ........................... 417/354 |
| 6,109,890 | A | * | 8/2000 | Horng .......................... 165/122 |
| 6,129,528 | A | * | 10/2000 | Bradbury et al. ......... 417/423.1 |
| 6,283,726 | B1 | * | 9/2001 | Fackelmann et al. ....... 417/366 |

* cited by examiner

Primary Examiner—Christopher Atkinson
(74) Attorney, Agent, or Firm—Niro, Scavone, Haller & Niro

(57) ABSTRACT

A heat-dissipating device for dissipating internal heat generated from the heat-dissipating device is provided. The heat-dissipating device includes a motor having a rotator and a stator for causing the rotator to rotate, and a fan connected with the rotator and having a hub having a slot and a plurality of holes thereon for rotating and dissipating the heat.

9 Claims, 2 Drawing Sheets

HEAT-DISSIPATING DEVICE

FIELD OF THE INVENTION

The present invention relates to a heat-dissipating device, and more particularly to a heat-dissipating device for dissipating internal heat generated from the heat-dissipating device.

BACKGROUND OF THE INVENTION

Heat-dissipation is always the crucial and essential problem in application of electric products. A good heat-dissipating mechanism usually represents a stable performance of the electric device. On the other hand, an electric device operated under an abnormal-dissipating condition will inevitably lead to an unstable performance and reduce the operation life of the electric device.

The heat-dissipating device generally has a motor for driving the heat-dissipating mechanism. A typical motor includes a rotator and a stator, wherein the rotator rotates circumambiently around the stator. Therefore, the heat-dissipating device itself is a source of heat. The heat generated by the rotation of the motor increases temperature of the heat-dissipating device, which leads to damage of the heat-dissipating device. In order to overcome the foresaid problem, the present invention provides a heat-dissipating device for dissipating internal heat generated from the heat-dissipating device.

SUMMARY OF THE INVENTION

It is therefore an object of the present invention to provide a heat-dissipating device for dissipating internal heat generated from the heat-dissipating device.

In accordance with the present invention, the heat-dissipating device includes a motor having a rotator and a stator for causing the rotator to rotate, and a fan connected with the rotator and having a hub having a slot and a plurality of holes thereon for rotating and dissipating the heat.

The heat-dissipating device further includes a frame engaged with the stator of the motor, and a circuit plate disposed in the frame and electrically connected with the stator for driving the rotator.

In addition, the fan further includes a plurality of blades to be rotated in a direction so as to draw air from an interior of the frame toward a front side of the fan.

In accordance with the present invention, the plurality of holes are disposed in the slot for dissipating the internal heat generated from the heat-dissipating device when the fan is rotated.

It is another object of the present invention to provide a heat-dissipating device for using in an electronic appliance to dissipate first heat generated from components of the electronic appliance and dissipate second heat generated from the heat-dissipating device.

In accordance with the present invention, the heat-dissipating device includes a fan having a hub having a slot and a plurality of holes thereon, a rotator engaged in the hub of the fan, and a stator for causing the rotator to rotate so as to dissipate the first heat generated from components of the electronic appliance and dissipate the second heat generated from the heat-dissipating device.

In addition, the fan further includes a plurality of blades to be rotated in a direction so as to draw air from an rear side of the fan toward a front side of the fan.

Furthermore, the plurality of holes are disposed in the slot for dissipating the first heat generated from components of the electronic appliance and dissipating the second heat generated from the heat-dissipating device.

It is another object of the present invention to provide a fan rotator assembly for using in a heat-dissipating device having a stator.

In accordance with the present invention, the fan rotor assembly includes a fan having a hub having a slot and a plurality of holes thereon, and a rotator engaged with the hub of the fan to be driven by the stator for causing the fan to rotate so as to dissipate heat generated from the heat-dissipating device.

Furthermore, the plurality of holes are disposed in the slot for dissipating the heat generated from the heat-dissipating device.

The present invention may best be understood through the following descriptions with reference to the accompanying drawings, in which:

DETAILED DESCRIPTION OF THE PREFERRED EMBODIMENTS

Figure 1:
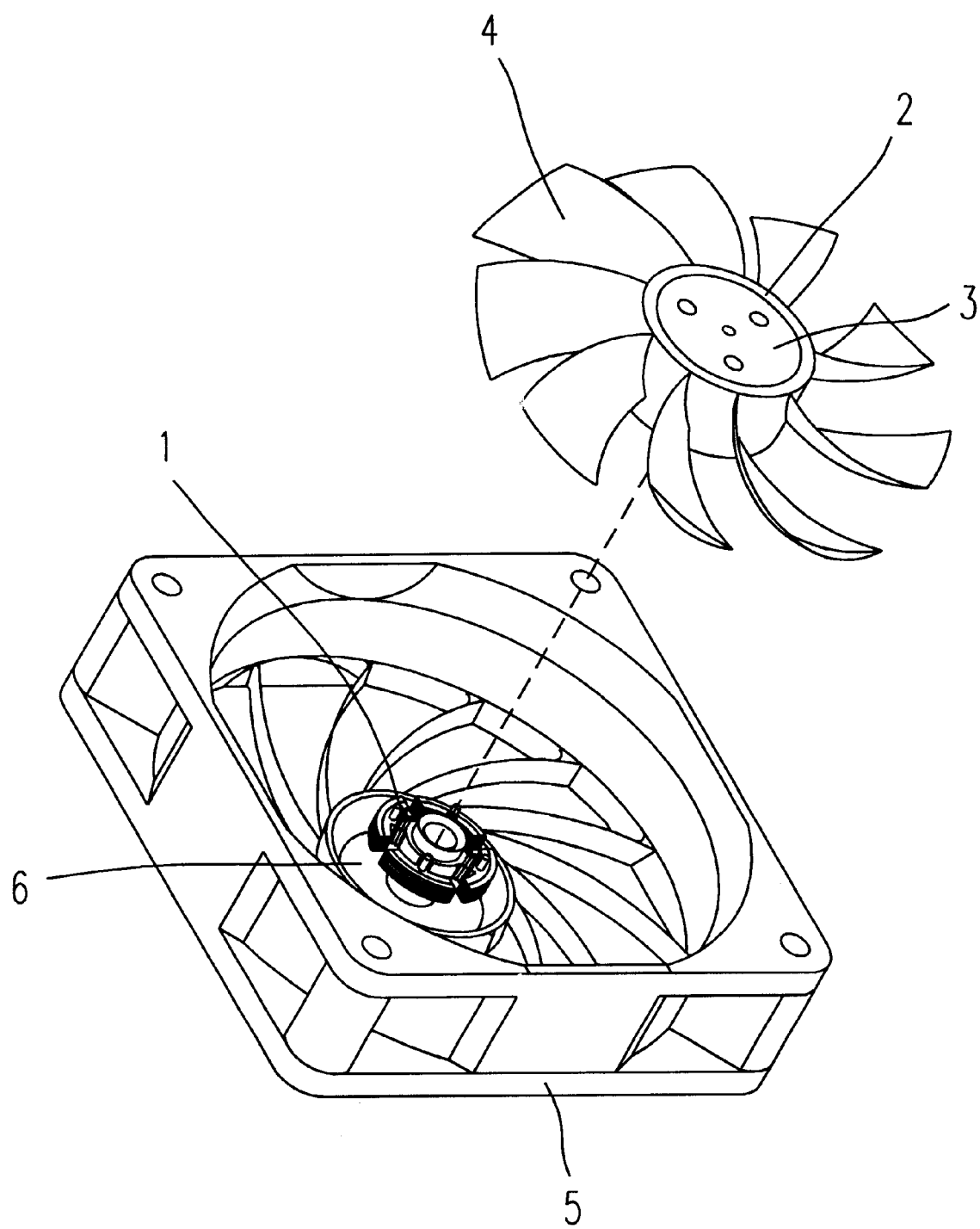
FIG. 1 is a schematic diagram illustrating the heat-dissipating device according to the preferred embodiment of the present invention.
Figure 2:
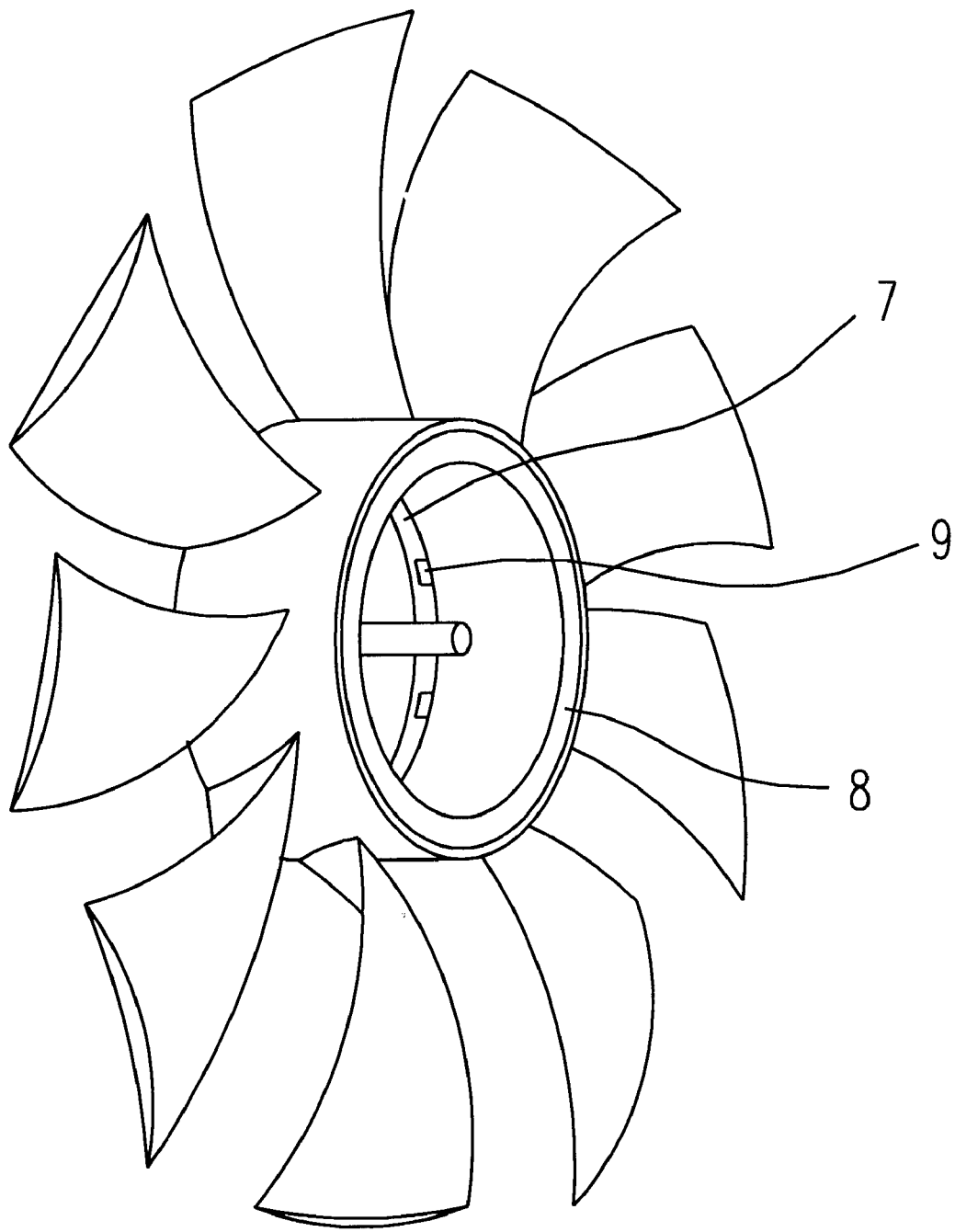
FIG. 2 is a schematic view showing the fan rotator assembly according to the preferred embodiment of the present invention.

Please refer to FIG. 1 and FIG. 2. The heat-dissipating device includes a motor, a fan 4 with a plurality of blades, a frame 5 and a circuit plate 6. In addition, the motor includes a stator 1 and a rotator 2, and the fan 4 includes a hub 3 having a slot 7 thereon. Certainly, the stator 1 further includes a coil (not shown), and the rotator further includes a magnet ring 8. There are a plurality of holes 9 disposed in the slot 7 of the hub 3.

When the heat-dissipating device is in operation, air is drawn from an interior of the frame 5 toward a front side of the fan 4. In the meanwhile, heat-dissipating currents are through the holes 9 disposed in the slot 7 of the hub 3. Therefore, the internal heat generated from the coil of the heat-dissipating device could be dissipated. The temperature of the motor of the heat-dissipating device could be reduced. In addition, because the holes 9 are disposed in the slot 7, which is an inner part of the heat-dissipating device, dust would not be drawn easily into the motor while the fan 4 is rotating.

Accordingly, the present invention provides a heat-dissipating device for dissipating the internal heat generated from the heat-dissipating device. Therefore, the performance of the motor could be maintained well and the operation life of the heat-dissipating device is prolonged.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A heat-dissipating device for dissipating internal heat generated from said heat-dissipating device, comprising:
   a motor having a rotator and a stator for causing said rotator to rotate; and
   a fan connected with said rotator and having a hub having a slot and a plurality of holes thereon for rotating and dissipating said heat.

2. The heat-dissipating device according to claim 1 further comprises:
   a frame engaged with said stator of said motor; and
   a circuit plate disposed in said frame and electrically connected with said stator for driving said rotator.

3. The heat-dissipating device according to claim 2, wherein said fan further comprises a plurality of blades to be rotated in a direction so as to draw air from an interior of said frame toward a front side of said fan.

4. The heat-dissipating device according to claim 1, wherein said plurality of holes are disposed in said slot for dissipating said internal heat generated from said heat-dissipating device when said fan is rotated.

5. A heat-dissipating device for using in an electronic appliance to dissipate first heat generated from components of said electronic appliance and dissipate second heat generated from said heat-dissipating device, comprising:
   a fan having a hub having a slot and a plurality of holes thereon;
   a rotator engaged in said hub of said fan; and
   a stator for causing said rotator to rotate so as to dissipate said first heat generated from components of said electronic appliance and dissipate said second heat generated from said heat-dissipating device.

6. The heat-dissipating device according to claim 5, wherein said fan further comprises a plurality of blades to be rotated in a direction so as to draw air from an rear side of said fan toward a front side of said fan.

7. The heat-dissipating device according to claim 5, wherein said plurality of holes are disposed in said slot for dissipating said first heat generated from components of said electronic appliance and dissipating said second heat generated from said heat-dissipating device.

8. A fan rotator assembly for using in a heat-dissipating device having a stator, comprising:
   a fan having a hub having a slot and a plurality of holes thereon; and
   a rotator engaged with said hub of said fan to be driven by said stator for causing said fan to rotate so as to dissipate heat generated from said heat-dissipating device.

9. The fan rotator assembly according to claim 8, wherein said plurality of holes are disposed in said slot for dissipating said heat generated from said heat-dissipating device.

* * * * *